United States Patent [19]
Parikh et al.

[11] Patent Number: 5,276,409
[45] Date of Patent: Jan. 4, 1994

[54] AUTOTUNING COMBINER STABILIZED AGAINST FREQUENCY DRIFT

[75] Inventors: Ajay Parikh, Gaithersburg; Stanley E. Kay, Rockville, both of Md.

[73] Assignee: Hughes Aircraft Company, Los Angeles, Calif.

[21] Appl. No.: 794,743

[22] Filed: Nov. 19, 1991

[51] Int. Cl.⁵ .......................... H01P 7/06; H03J 9/00
[52] U.S. Cl. .................................. 333/17.1; 333/231; 333/233; 455/125
[58] Field of Search ............... 455/229, 339, 340, 307, 455/178.1, 170.1, 121, 123–; 333/17.1, 15, 16, 174, 229, 231–

[56] References Cited
U.S. PATENT DOCUMENTS

| | | |
|---|---|---|
| 3,906,368 | 9/1975 | Eckenbrecht .................. 333/17.1 X |
| 4,462,009 | 7/1984 | Londt et al. ..................... 333/17.1 |
| 4,726,071 | 2/1988 | Jachowski ................... 333/17.1 X |

FOREIGN PATENT DOCUMENTS 224405 9/1990 Japan .

*Primary Examiner*—Benny Lee
*Attorney, Agent, or Firm*—Gordon R. Lindeen, III; William J. Streeter; Wanda Denson-Low

[57] ABSTRACT

An autotuning combiner particularly for use in combining signals for radio telephony transmission. The combiner has a series of filter cavities each with an adjuster for fine-tuning the cavity to an input carrier signal. The combiner cavities are stabilized from positional drift in the absence of a carrier signal by means of a mechanical brake which holds the adjuster or a pilot signal generator which simulates the absent carrier signal.

25 Claims, 3 Drawing Sheets

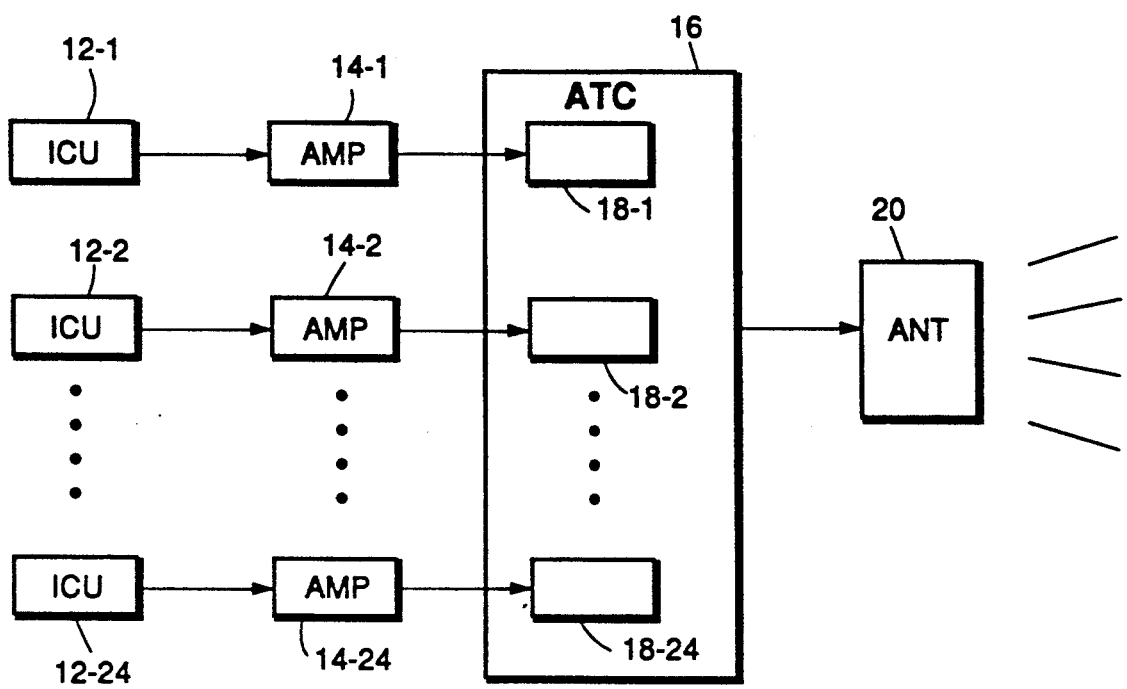
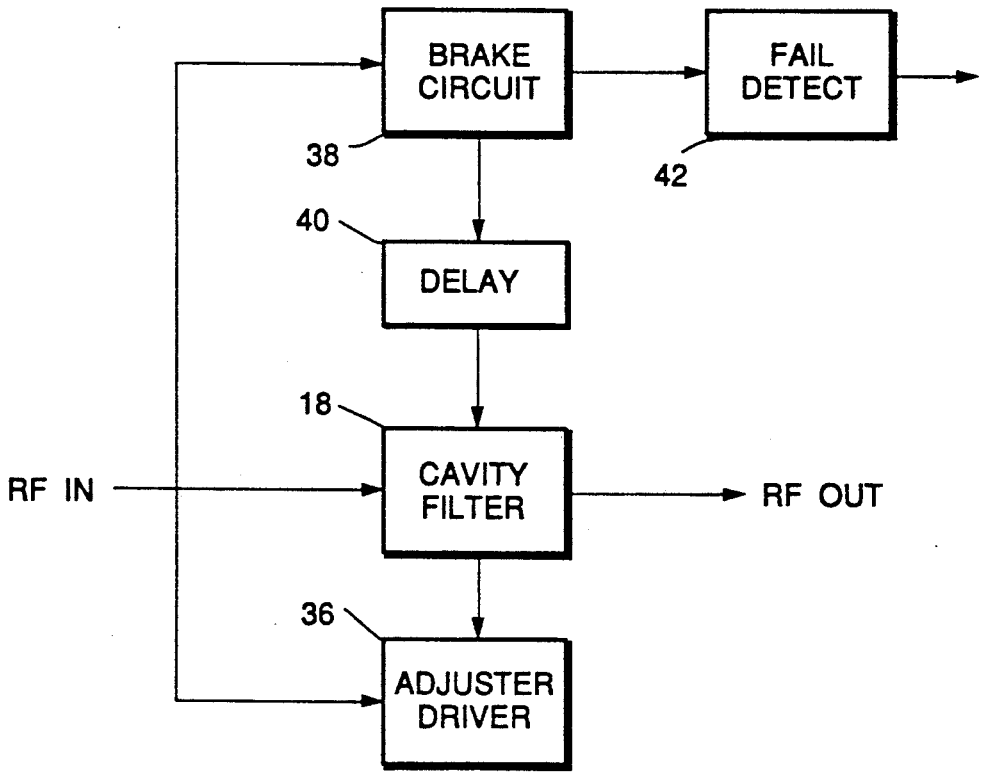
FIG. 1.
FIG. 2.

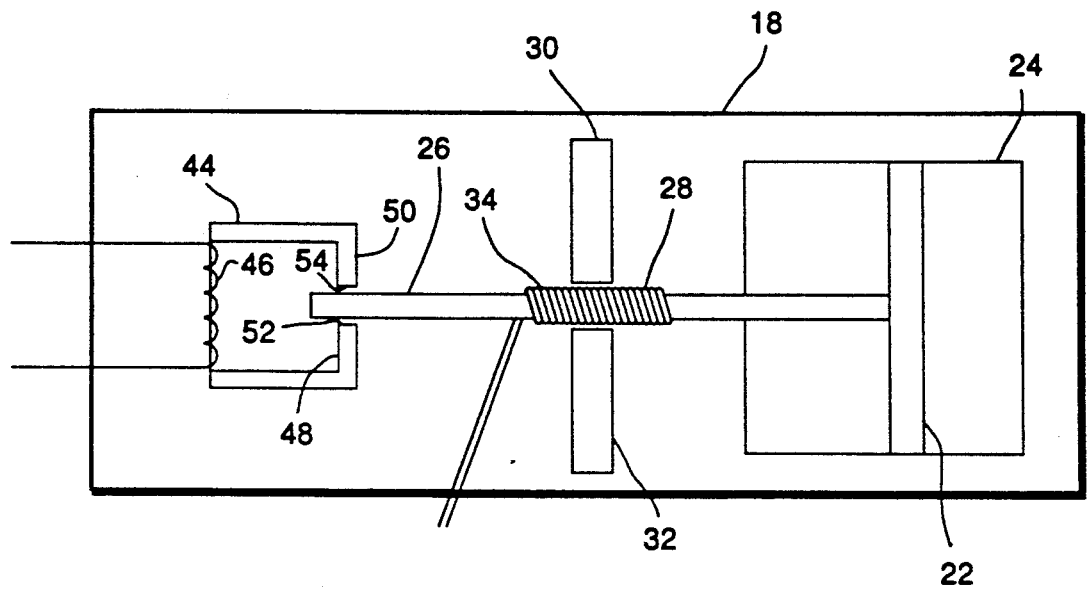
FIG. 4a.
FIG. 4b.
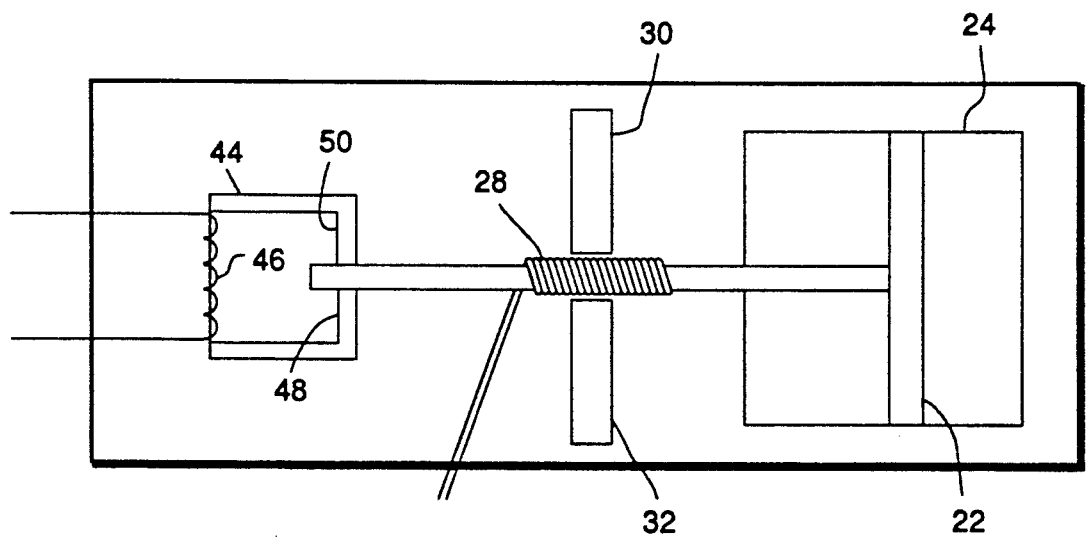

AUTOTUNING COMBINER STABILIZED AGAINST FREQUENCY DRIFT

FIELD OF THE INVENTION

The present invention relates to the field of autotuning combiners used for telephony, especially for cellular base stations and in particular to transmit combiners which stabilize at a particular tuned frequency in the absence of a transmit signal.

BACKGROUND OF THE INVENTION

In cellular telephony, it is common to feed radio signals generated by individual channel units into amplifiers and then to combine these signals in an autotuning combiner before relaying them further to an antenna for broadcast to subscriber units. A common type of autotuning combiner has a set of cavity filters which are tuned using an adjuster. The adjuster is a moving mechanical element inside a physical cavity which is moved within the cavity to adjust the resonant frequency of the cavity. Typically, such an adjuster is tuned based on the radio frequency signal received from the amplifier. However, when the radio frequency signal is turned off, the resonant frequency of the cavity is free to drift. This resonant frequency drift can result from drift of the adjuster position or environmental effects and results in a one-half to two second delay in the effectiveness of the filter when a new RF frequency signal is received. In most telephony applications this delay is of little concern because there is a one-half to two second delay between the initiation of a telephone call and the transmission of any significant information. However, in other telephony applications, it may be desirable to transmit information immediately upon the establishment of a telephone call. It may also be desirable to transmit information on the carrier frequency in bursts with short delays between the signal bursts. In such a system, the extended delay would distort or destroy a significant amount of the data in each burst.

SUMMARY OF THE INVENTION

The present invention provides for an autotuning combiner which locks onto a particular frequency even when that frequency is interrupted or no longer received. As a result, when the signal resumes, there is little or no delay for the adjuster to retune itself to the old frequency. In one embodiment, the invention encompasses an improvement to an autotuning combiner wherein the adjuster is subject to positional drift comprising means for preventing adjuster positional drift in the absence of an input carrier frequency. The means for preventing can be a brake for holding a combiner tuning rod in the absence of an input carrier frequency and releasing the tuning rod in the presence of a carrier frequency. The brake preferably comprises a magnetically driven brake shaft having a friction surface for engaging the tuning rod in an engaged position for preventing its movement. A brake shaft drive circuit coupled to an input carrier signal detector drives the brake shaft to the unengaged position in the absence of the detection of an input carrier signal.

BRIEF DESCRIPTION OF THE DRAWINGS

These and other aspects of the invention will be more fully understood by referring to the following detailed description and the accompanying drawings, wherein:

FIG. 1 is a block diagram showing a portion of a cellular telephony base station incorporating an autotuning combiner.

FIG. 2 is a block diagram showing a cavity filter and related components incorporating the present invention and suitable for application to the combiner of FIG. 1.

FIG. 4A is a representation of a cavity filter and associated brake components according to the present invention.

FIG. 4B is a representation of the cavity filter and associated components of FIG. 4B in which the brake is in an engaged position.

DETAILED DESCRIPTION OF THE INVENTION

Figure 3:
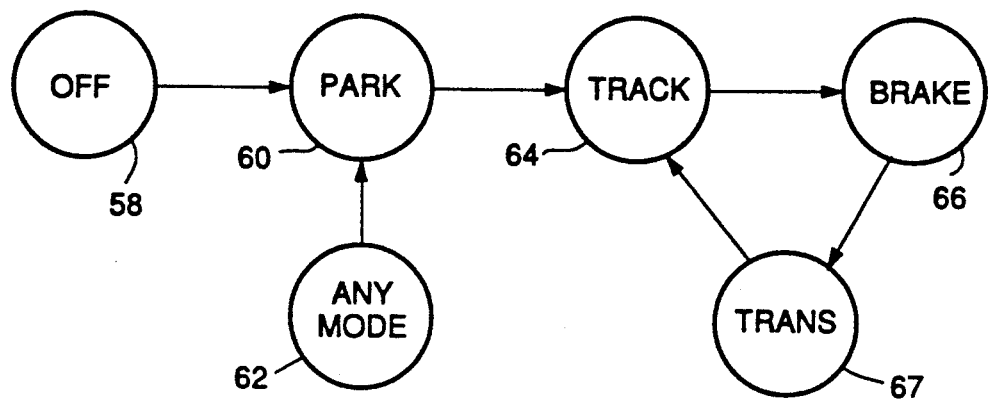
FIG. 3 is a state diagram illustrating the operation of the cavity filter of FIG. 2.

Referring to FIG. 1 a typical cellular base station transmitting section has a set of twenty-four (24) individual channel units (ICU) 12-1 to 12-24. Each ICU is assigned to a particular frequency channel within the range of frequencies over which cellular telephony is conducted. Each ICU typically remains at or near the frequency to which it is assigned for the duration of its lifetime and in a typical analog system would correspond to a specific telephone conversation. The ICU's are coupled each to an amplifier 14-1 to 14-24 and from the amplifier into an autotuning combiner block (ATC) 16. The ATC is typically composed of a set of six smaller combiners coupled together each made up of four separate cavity filters 18-1 to 18-24. The cavity filters filter the signals and allow them to be combined by the ATC block for transmission to an antenna 20. From the antenna, the signals are transmitted through the airwaves at the assigned radio frequencies to individual subscriber units in the field. Referring to FIG. 4A, 4B in a typical design each cavity filter 18 has an adjuster 22 which is mounted inside an actual physical cavity 24. The adjuster moves within the cavity to tune the cavity to the frequency of the carrier signal upon which the ICU is sending its signals. A tuning rod 26 extends from the adjuster out of the cavity 24 and is equipped with a winding 28 positioned between corresponding North 30 and South 32 pole magnetic elements so that the precise position of the adjuster can be moved by applying a magnetic field through a winding 34 about the tuning rod. The magnetic field in the winding creates a force with respect to the North and South pole magnetic elements to translate the position of the adjuster.

As shown in FIG. 2, the position of the adjuster is controlled by an adjuster driver circuit 36. The adjuster driver circuit listens to the radio frequency (RF) input signal coming from the amplifier 14 and drives the adjuster to fine-tune the resonant frequency of the cavity of the cavity filter 18 as is well known in the art. The cavity filter when tuned, produces a filtered RF output signal (RF OUT). However, because the adjuster driver depends at least in part on the frequency of the input carrier signal from the amplifier, when this signal is shut off, the adjuster driver is typically shut off as well. Due to physical disturbances, heating effects and other environmental changes in the ATC, among other things, the adjuster frequently drifts out of position when the input carrier signal is shut off. In known cavity filters, this is not compensated for in any way. The adjuster driver simply readjusts the adjuster when the carrier signal is turned back on creating a delay of ½ to 2 seconds between the start of a carrier signal and effective filtering of the signal.

In the present invention, this problem is overcome in one embodiment by using a brake circuit 38. The purpose of the brake circuit is to prevent the adjuster from drifting out of position when an RF carrier frequency signal is not present at the cavity filter input. The brake circuit 38 acts through a delay circuit 40 directly on the cavity filter adjuster preferably bypassing the adjuster driver circuit. A fail detection circuit 42 is preferably coupled to the brake circuit to indicate a failure of the brake circuit. The brake circuit, like the adjuster driver circuit, receives the carrier signal input to detect the presence or absence of a carrier signal. The carrier signal detection is preferably performed by detecting whether the signal amplitude exceeds a predetermined noise threshold. When the absence of a carrier signal is detected, the brake circuit operates to hold the position of the adjuster until a carrier signal is again detected. This maintains the adjuster in the same fine-tuning position as before so that the only further tuning needed is that necessary to make up for drift in the filter cavity resonant frequency. The carrier signal is normally highly reliable and cavity resonant frequency drift is normally slight. Accordingly, the cavity filter is ready for optimal operation almost instantly.

It has been found, at least in some cellular telephony operations, that it is desirable to transmit data in intermittent bursts with gaps in the carrier signal. The bursts may be rather short, on the order of a few milliseconds with gaps of 40 milliseconds or so between bursts. When the channel is temporarily inactive, it may be desirable to have a gap of several hundred milliseconds between bursts or groups of bursts. For shorter gaps, the likelihood of adjuster drift is very slight.

Accordingly, it is preferred that the brake circuit not be activated for these short periods. However, for longer interruptions of the carrier signal, for example, two hundred or more milliseconds, the adjuster is very likely to drift and the brake circuit is activated. In order to control the operation of the brake circuit, a delay circuit 40 constructed using techniques known in the art is interposed between the brake circuit and the cavity filter to delay application of the brake unless the absence of a carrier signal lasts for more than preferably 200 milliseconds. The release of the brake, however, is preferably instantaneous upon the resumption of the carrier frequency.

FIGS. 4A and 4B show one preferred implementation of a brake for preventing movement of the adjuster in the absence of a carrier signal. The brake element has an electrically conductive C-shaped clamp 44 with a conductive winding 46 on one portion. The winding powered by the brake circuit 38 drives a current through the electrically conducting clamp 44 to stimulate an electric field in ferro-magnetic surfaces 48 and 50. The surfaces form North and South magnetic poles on either side of the tuning rod. The tuning rod is typically constructed of a dielectric material, for example, glass, so that it has no effect on the magnetic field generated by the ferromagnetic materials. These materials, being of opposite magnetic orientations, are drawn towards each other against the surface of the glass tube as shown in FIG. 4B. Each electromagnetic pole has a friction surface 52, 54 which creates a friction against the tuning rod to prevent the tuning rod from moving. The brake is released by the brake circuit simply by interrupting the current in the winding 46.

The operational modes of the stabilized autotuning combiner can be more easily understood with reference to FIG. 3. Initially, the combiner is in the OFF mode 58. From the OFF mode, it is moved to a PARK mode 60 upon initial power up or upon receipt of a PARK command from any other mode 62. The PARK mode tunes the cavity filter to an out-of-band frequency to prevent interference with other signals. From the PARK mode, the cavity filter is sequenced into a TRACK mode 64. This mode transition is caused by receipt of a transmit carrier frequency signal from the amplifier 14. The cavity filter remains in the TRACK mode as long as it detects a carrier signal. In a conventional cavity filter, upon the detection of the absence of a carrier signal, the cavity filter would revert back to the PARK mode or would simply drift, waiting for a park command. However, in the present invention, the cavity filter transitions to a brake mode 66 upon the detection of the absence of a carrier signal. The cavity filter remains in this mode until it detects that the carrier signal has resumed in which case it reverts back to the TRACK mode 64 by releasing the brake. In the transition between the brake mode and the track mode, the filter enters a TRANSITIONAL mode 67. The filter remains in this mode for one half to two seconds until the adjuster driver circuit 36 resumes operation. As explained above, the interruption of the carrier signal can correspond either to a gap between data bursts or the termination of communication on that channel. Because of the brake mode, the cavity is normally tuned very close to the carrier frequency and operates fully during the transition mode.

Figure 5:
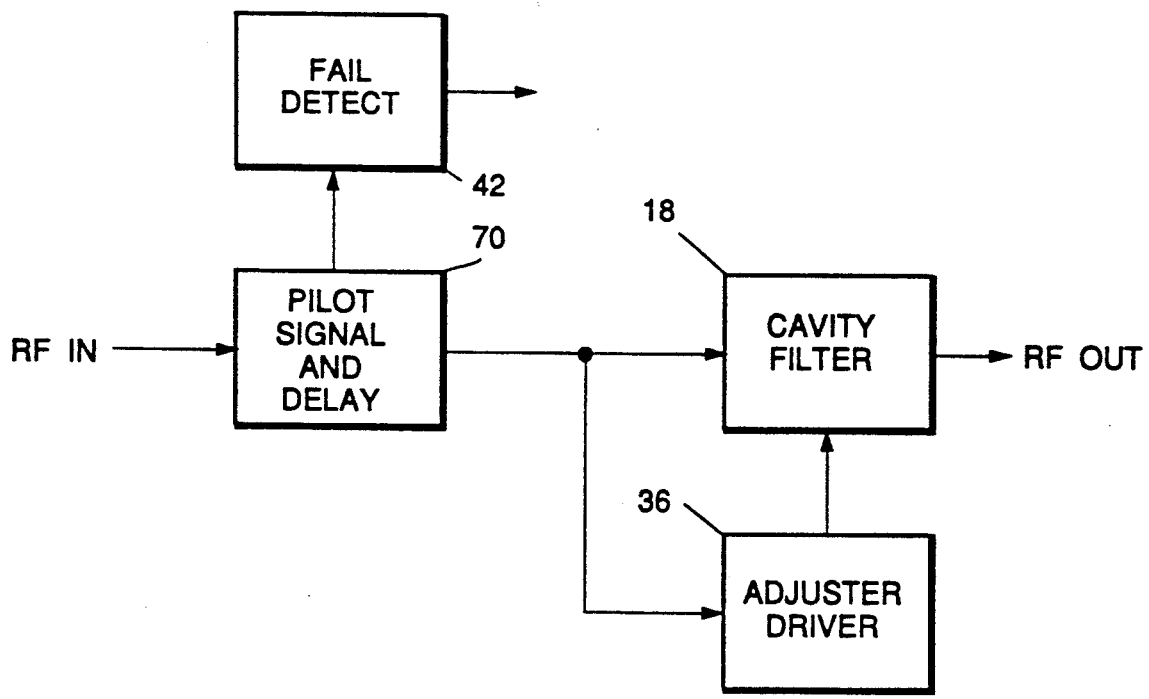
FIG. 5 is a block diagram of a cavity filter and related components similar to that of FIG. 2 showing an alternate embodiment.

An alternative embodiment of the invention which similarly prevents drift of the adjuster during interruptions in the carrier signal input is shown in FIG. 5. In FIG. 5, the carrier signal (RF IN) is directed first to a pilot signal generator with timing and delay elements 70 and then to the adjuster driver 36 and cavity filter 18. The cavity filter produces a filtered RF output signal (RF OUT) as with the embodiment of FIG. 2. The adjuster driver controls the cavity filter 18 in the same manner as described above with respect to FIG. 2. The pilot signal generator operates to produce a low level pilot signal upon the detection of an interruption in the carrier frequency. This pilot signal is generated to simulate the frequency of the carrier signal and is input to the cavity filter just as the carrier signal would be at a reduced level in order to reduce co-channel interference. It is preferred that the pilot signal be at a level about 30 db lower than the carrier signal. This can allow carrier frequencies to be closer together due to the reductions in interference with neighboring frequencies. Accordingly, the adjuster is tuned to the pilot signal in the absence of a carrier frequency. A failure detection module 42 is connected to the pilot signal generator in order to detect failures for diagnostic purposes. A constant pilot signal is not necessary and may interrupt the detection of a carrier frequency. Accordingly, the pilot signal is transmitted only for short periods, preferably approximately two (2) seconds, which are sufficient only to readjust the drifting position of the adjuster. The signal need only be transmitted every thirty to sixty minutes. In other respects, the pilot signal generator, 70, through its timing and delay elements, acts in a manner similar to the brake circuit 38 and delay 40 of FIG. 2 including waiting for a predetermined time, preferably about 200 ms, after detecting the absence of the input carrier signal before applying the pilot signal.

Although only a few embodiments have been discussed above, it will be apparent to those skilled in the art that a variety of modifications and adaptations can be made to the embodiments described above without departing from the spirit and scope of the present invention. The pilot signal generator and brake circuit can be combined for redundancy. A variety of different types of mechanisms for preventing movement of the tuning rod may be employed and the specific durations of intervals and delays can be modified to suit particular communications formats. The stabilization improvement can also be adapted for application to different types of filters than those corresponding to the ones shown in the present application. The scope of the present invention is not to be limited by the embodiments described above but only by the appended claims.

What is claimed is:

1. A autotuning cavity filter for use in a combiner of multiple channels for radio transmission comprising:
   a carrier signal input port for receiving a carrier signal;
   a resonant cavity coupled to the input port;
   an adjuster, movable in for adjusting a resonant frequency associated with the resonant cavity;
   a tuning rod extending from the adjuster out of the cavity;
   an automatic tuning circuit including means for moving the tuning rod, the tuning circuit adjusting the resonant frequency as related with the resonant cavity by moving the tuning rod to match with a frequency of a carrier signal received at the input port, the adjuster being subject to positional drift in the absence of carrier signal input; and
   mean associated with the adjuster for preventing adjuster positional drift in the absence of a carrier signal.

2. The combiner of claim 1 wherein the means for preventing comprises a brake for holding the tuning rod in the absence of an input carrier signal and releasing the tuning rod in the presence of the input carrier signal.

3. The combiner of claim 2 wherein the brake comprises:
   a magnetically driven brake shaft having a friction surface for engaging the tuning rod, the brake shaft having an engaged position contacting the tuning rod for preventing movement thereof and an unengaged position for allowing movement of the tuning rod;
   an input carrier signal detector; and
   a brake shaft drive circuit coupled to the detector and the brake shaft for driving the brake shaft to the engaged position in the absence of the detection of the input carrier signal.

4. The combiner of claim 3 comprising a delay circuit coupled to the brake shaft drive circuit for delaying the driving of the brake shaft to the engaged position in the absence of the input carrier signal.

5. The combiner of claim 4 wherein the delay circuit generates a 200 ms delay of the driving.

6. The combiner of claim 1 wherein the means for preventing comprises a pilot signal generator for producing a pilot signal representative of the input carrier signal and for providing the pilot signal to the resonant cavity in the absence of the input carrier signal.

7. The combiner of claim 6 comprising a timing circuit for intermittently stimulating the provision of the pilot signal generator to provide the pilot signal to the resonant cavity at determined intervals and for limiting the duration of each stimulated pilot signal.

8. The combiner of claim 7 wherein each stimulated provision of the pilot signal has a duration of approximately 2 seconds.

9. The combiner of claim 1 comprising a delay circuit for delaying the application of the means for preventing so that brief absences of the input carrier signal do not result in application of the means for preventing.

10. The combiner of claim 1 comprising a detector for detecting application of the means for preventing, for detecting the presence of an input carrier signal, and for generating a failure signal when both the means for preventing is not applied and an input carrier signal is not detected.

11. In a cavity filter which automatically tunes a resonant cavity with a frequency of an input carrier signal, a method for preventing positional drift of an adjuster with the resonant cavity in the absence of the input carrier signal comprising:
   detecting the absence of the input carrier signal in the resonant cavity;
   applying a means for preventing movement of the adjuster upon detection of the absence of the input carrier signal;
   releasing the means for preventing movement upon the detection of the input carrier signal.

12. The method of claim 11 comprising the step of modifying the adjuster position to track the input carrier signal upon a determined duration after the detection of the input carrier signal.

13. The method of claim 11 wherein the step of applying a means for preventing comprises driving a solenoid driven brake shaft into contact with a tuning rod connected to the adjuster to prevent movement of the adjuster.

14. The method of claim 11 comprising the step of waiting a predetermined length of time after detecting the absence of the input carrier signal before applying the means for preventing.

15. The method of claim 14 wherein the step of waiting comprises waiting for 200 ms.

16. The method of claim 11 comprising the step of generating a brake failure signal upon detection of a failure of the means for preventing.

17. In a cavity filter which automatically tunes a resonant cavity with an adjuster to match a frequency of an input carrier signal, a method for preventing positional drift of the adjuster within the resonant cavity in the absence of the input carrier signal comprising:
   detecting the absence of the input carrier signal in the resonant cavity;
   generating a pilot signal representative of the last detected input carrier signal;
   applying the pilot signal to the resonant cavity upon detection of the absence of the input carrier signal so that the adjuster tunes to the pilot signal.

18. The method of claim 17 wherein the step of application of the pilot signal comprises waiting for a predetermined time after detecting the absence of the input carrier signal before applying the pilot signal.

19. The method of claim 18 wherein the step of waiting comprises waiting for 200 ms.

20. The method of claim 17 wherein the step of applying comprises applying the pilot signal intermittently for a determined duration.

21. A cavity filter having an adjuster in a resonant cavity movable for adjusting the resonant frequency of the resonant cavity in response to an input carrier signal wherein the adjuster is subject to positional drift, the combiner characterized by means for preventing adjuster positional drift in the absence of the input carrier signal.

22. The cavity filter of claim 21 comprising a tuning rod connected to an adjuster and extending from the adjuster out of the cavity and wherein the means for preventing comprises:
   a magnetically driven brake shaft having a friction surface for engaging the tuning rod, the brake shaft having an engaged position for contacting the tuning rod for preventing movement thereof and an unengaged position for allowing movement of the tuning rod;
   an input carrier signal detector; and
   a brake shaft drive circuit coupled to the detector and the brake shaft for driving the brake shaft to the engaged position in the absence of the detection of the input carrier signal.

23. The cavity filter of claim 22 comprising a delay circuit coupled to the brake shaft drive circuit and the input carrier signal detector for delaying the driving of the brake shaft to the engaged position in the absence of the input carrier signal.

24. The cavity filter of claim 21 wherein the means for preventing comprises a brake for holding the adjuster in the absence of the input carrier signal and releasing the adjuster in the presence of the input carrier signal.

25. The cavity filter of claim 21 wherein the means for preventing comprises a pilot signal generator for producing a pilot signal representative of the input carrier signal and providing the pilot signal to the resonant cavity in the absence of the input carrier signal.

* * * * *

UNITED STATES PATENT AND TRADEMARK OFFICE
CERTIFICATE OF CORRECTION

PATENT NO. : 5,276,409

DATED : January 4, 1994

INVENTOR(S) : Ajay Parikh, Stanley Kay

It is certified that error appears in the above-identified patent and that said Letters Patent is hereby corrected as shown below:

In Claim 1, column 5, the following change should be incorporated into the text:

Line 33, change "resonant frequency as related. . ." to "resonant frequency associated. . ."

In Claim 2, column 5, the following change should be incorporated into the text:

Line 43, change "absence of an. . ." to "absence of the. . ."

Signed and Sealed this

Twentieth Day of September, 1994

*Attest:*

BRUCE LEHMAN

*Attesting Officer*  *Commissioner of Patents and Trademarks*